United States Patent
Tysman

(10) Patent No.: US 11,041,917 B2
(45) Date of Patent: Jun. 22, 2021

(54) SENSING SYSTEMS WITH ORIENTATION SELECTION MECHANISMS

(71) Applicant: ALLISON TRANSMISSION, INC., Indianapolis, IN (US)

(72) Inventor: John L. Tysman, Zionsville, IN (US)

(73) Assignee: ALLISON TRANSMISSION, INC., Indianapolis, IN (US)

( * ) Notice: Subject to any disclaimer, the term of this patent is extended or adjusted under 35 U.S.C. 154(b) by 232 days.

(21) Appl. No.: 16/405,186

(22) Filed: May 7, 2019

(65) Prior Publication Data
US 2020/0355755 A1 Nov. 12, 2020

(51) Int. Cl.
*G01R 33/07* (2006.01)
*G01R 33/00* (2006.01)

(52) U.S. Cl.
CPC ......... *G01R 33/0047* (2013.01); *G01R 33/07* (2013.01)

(58) Field of Classification Search
CPC ............... H03K 17/95; H03K 17/9505; G01R 33/0047; G01R 33/07
See application file for complete search history.

(56) References Cited

U.S. PATENT DOCUMENTS

| 4,745,363 A | 5/1988 | Carr et al. |
| 5,781,005 A | 7/1998 | Vig et al. |

FOREIGN PATENT DOCUMENTS

EP    0907068 B1    5/2004

*Primary Examiner* — Son T Le
(74) *Attorney, Agent, or Firm* — Taft Stettinius & Hollister LLP; Stephen F. Rost

(57) ABSTRACT

Sensing systems and methods of adjusting sensing systems are disclosed herein. A sensing system includes a sensor, an sensor mount, a retainer, and an orientation selection mechanism. The sensor is configured to provide a signal indicative of an operational characteristic of a sensed component. The sensor mount is sized to receive the sensor and configured for attachment to the sensed component to couple the sensor thereto. The retainer is sized for receipt by the sensor mount and configured to retain the sensor when the sensor is received by the sensor mount. The orientation selection mechanism is configured to permit selection of an orientation of the sensor relative to one or more sensing targets when the sensor is received by the sensor mount.

20 Claims, 4 Drawing Sheets

SENSING SYSTEMS WITH ORIENTATION SELECTION MECHANISMS

FIELD OF THE DISCLOSURE

The present disclosure relates, generally, to sensing systems, and, more specifically, to sensing systems incorporating a hall effect sensor.

BACKGROUND

The performance of a hall effect sensor may depend on the orientation of the hall effect sensor relative to a target. To orient a hall effect sensor relative to a target, a fastener may be coupled to the hall effect sensor such that the fastener is aligned with a portion of the hall effect sensor. In some cases, it may be undesirable to form a hole in a hall effect sensor to receive a fastener. Provision of a sensing system incorporating a hall effect sensor that does not utilize a separate fastener or a hole therefor to orient the sensor relative to a target remains an area of interest.

SUMMARY

The present disclosure may comprise one or more of the following features and combinations thereof.

According to one aspect of the present disclosure, a sensing system may include a sensor, a sensor mount, a retainer, and an orientation selection mechanism. The sensor may be configured to provide a signal indicative of an operational characteristic of a sensed component. The sensor mount may be sized to receive the sensor and configured for attachment to the sensed component to couple the sensor thereto. The retainer may be sized for receipt by the sensor mount and configured to retain the sensor when the sensor is received by the sensor mount. The orientation selection mechanism may be configured to permit selection of an orientation of the sensor relative to one or more sensing targets when the sensor is received by the sensor mount. The orientation selection mechanism may include a first feature included in the sensor and a second feature included in the sensor mount. The first and second features may cooperate to permit selection of the orientation of the sensor relative to the one or more sensing targets in use of the sensing system.

In some embodiments, the sensor may be a hall effect sensor that includes a sensor body and a shoulder extending outwardly from the sensor body, and the sensor mount may be sized to receive the sensor body and the shoulder. The sensor mount may be formed to include an inner groove sized to receive the shoulder, and the retainer may include a wave spring that is positioned in the inner groove in contact with the sensor mount and the shoulder when the sensor is received by the sensor mount. The sensor mount may include a neck having a first diameter and a head having a second diameter greater than the first diameter, and the wave spring may be configured to bias the shoulder toward the neck when the sensor is received by the sensor mount. The neck may be configured to receive a portion of the sensor body and the head may be configured to receive another portion of the sensor body and the shoulder. The neck may include external threads that may be used to attach the sensor mount to the sensed component.

In some embodiments, the sensor may include a sensor body extending along an axis and a shoulder extending outwardly from the sensor body, the first feature may include a tab extending outwardly from the shoulder, and the second feature may include an inner indexing ring that extends around the axis when the sensor is received by the sensor mount. The inner indexing ring may be formed to include a plurality of notches each configured for interaction with the tab to permit selection of the orientation of the sensor relative to the one or more sensing targets in use of the sensing system. The plurality of notches may be circumferentially spaced from one another about the axis when the sensor is received by the sensor mount, and the sensor may be configured for rotation about the axis when the sensor is received by the sensor mount such that the tab may interact with any one of the plurality of notches to permit selection of the orientation of the sensor relative to the one or more sensing targets in use of the sensing system. The sensor may be movable relative to the sensor mount along the axis against a bias of the retainer when the sensor is received by the sensor mount to permit rotation of the sensor about the axis.

In some embodiments, the sensor may be formed without a hole to receive a fastener to secure the sensor to the sensed component.

According to another aspect of the present disclosure, a sensing system may include a hall effect sensor, a sensor mount, a wave spring, and an orientation selection mechanism. The hall effect sensor may be configured to provide a signal indicative of an operational characteristic of a sensed component. The hall effect sensor may include a sensor body extending along an axis and a shoulder extending outwardly from the sensor body. The sensor mount may be sized to receive the hall effect sensor and configured for attachment to the sensed component to couple the hall effect sensor thereto. The sensor mount may be formed to include an inner groove sized to receive the shoulder. The wave spring may be configured to retain the hall effect sensor when the hall effect sensor is received by the sensor mount. The wave spring may be positioned in the inner groove in contact with the sensor mount and the shoulder when the hall effect sensor is received by the sensor mount. The orientation selection mechanism may be configured to permit selection of one orientation of a plurality of discrete orientations of the hall effect sensor relative to one or more sensing targets when the hall effect sensor is received by the sensor mount. The orientation selection mechanism may include a tab included in the hall effect sensor that extends outwardly from the shoulder and an inner indexing ring included in the sensor mount that extends around the axis when the hall effect sensor is received by the sensor mount. The inner indexing ring may be formed to include a plurality of notches each configured for interaction with the tab to permit selection of the one orientation of the plurality of discrete orientations of the hall effect sensor relative to the one or more sensing targets in use of the sensing system.

In some embodiments, the plurality of notches may be circumferentially spaced from one another about the axis when the hall effect sensor is received by the sensor mount. The hall effect sensor may be configured for rotation about the axis when the hall effect sensor is received by the sensor mount such that the tab may interact with any one of the plurality of notches to permit selection of the one orientation of the hall effect sensor relative to the one or more sensing targets in use of the sensing system. The hall effect sensor may be movable relative to the sensor mount along the axis against a bias of the wave spring when the hall effect sensor is received by the sensor mount to permit rotation of the hall effect sensor about the axis.

In some embodiments, the sensor may be formed without a hole to receive a fastener to secure the sensor to the sensed component. The orientation selection mechanism may lack a fastener.

According to yet another aspect of the present disclosure, a method of adjusting a sensing system coupled to a sensed component, the sensing system including a sensor having a sensor body and a shoulder extending outwardly therefrom, a sensor mount that receives the sensor such that the sensor has an initial orientation relative to one or more sensing targets, a biasing element held by the sensor mount, and an orientation selection mechanism, may include advancing the sensor body relative to the sensor mount against a bias of the biasing element such that a tab of the orientation selection mechanism that extends outwardly from the shoulder is spaced from an inner indexing ring of the orientation selection mechanism that extends around an axis, moving the sensor relative to the sensor mount to select one orientation of a plurality of discrete orientations of the sensor relative to the one or more sensing targets that is different from the initial orientation, and releasing the sensor such that the bias of the biasing element urges the tab into interaction with one of a plurality of notches of the inner indexing ring to place the sensor in the one selected orientation.

In some embodiments, advancing the sensor body relative to the sensor mount may include translating the sensor body relative to the sensor mount along the axis. Moving the sensor relative to the sensor mount may include rotating the sensor body relative to the sensor mount about the axis.

These and other features of the present disclosure will become more apparent from the following description of the illustrative embodiments.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1:
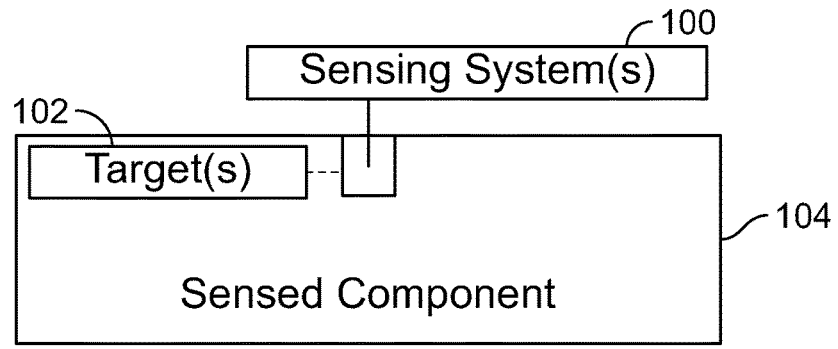
FIG. 1 is a diagrammatic view of a sensing system configured to sense one or more targets coupled to a sensed component.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

In the drawings, some structural or method features, such as those representing devices, modules, instructions blocks and data elements, may be shown in specific arrangements and/or orderings for ease of description. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

In some embodiments, schematic elements used to represent blocks of a method may be manually performed by a user. In other embodiments, implementation of those schematic elements may be automated using any suitable form of machine-readable instruction, such as software or firmware applications, programs, functions, modules, routines, processes, procedures, plug-ins, applets, widgets, code fragments and/or others, for example, and each such instruction may be implemented using any suitable programming language, library, application programming interface (API), and/or other software development tools. For instance, in some embodiments, the schematic elements may be implemented using Java, C++, and/or other programming languages. Similarly, schematic elements used to represent data or information may be implemented using any suitable electronic arrangement or structure, such as a register, data store, table, record, array, index, hash, map, tree, list, graph, file (of any file type), folder, directory, database, and/or others, for example.

Further, in the drawings, where connecting elements, such as solid or dashed lines or arrows, are used to illustrate a connection, relationship, or association between or among two or more other schematic elements, the absence of any such connection elements is not meant to imply that no connection, relationship, or association can exist. In other words, some connections, relationships, or associations between elements may not be shown in the drawings so as not to obscure the disclosure. In addition, for ease of illustration, a single connecting element may be used to represent multiple connections, relationships, or associations between elements. For example, where a connecting element represents a communication of signals, data or instructions, it should be understood by those skilled in the art that such element may represent one or multiple signal paths (e.g., a bus), as may be needed, to effect the communication.

Referring now to FIG. 1, an illustrative sensing system 100 is coupled to, or otherwise included in, a sensed component 104. In some embodiments, the sensed component 104 may be embodied as, or otherwise include, a shaft or a gear supported by a shaft, for example. The sensing system 100 is configured to sense the presence or absence of sensing targets 102 coupled to, or otherwise included in, the sensed component 104. In some embodiments, each of the sensing targets 102 may be embodied as, or otherwise include, a feature (e.g., a tooth, spline, projection, tab, etc.) coupled to, or otherwise included in, the sensed component 104 whose presence or absence may be detected by the sensing system 100 to sense an operational characteristic of the sensed component 104. In some embodiments, each of the sensing targets 102 may be embodied as, include, or be coupled to a magnet configured to generate a magnetic field that may be detected by the sensing system 100. In any case, the sensing system 100 is configured to provide a signal indicative of an operational characteristic of the sensed component 104 that is dependent upon, or otherwise associated with, detection of the presence or absence of the sensing targets 102.

In the illustrative embodiment, the sensed component 104 is embodied as, or otherwise includes, a component configured for rotation to produce, transmit, distribute, and/or store rotational power in use thereof. In some embodiments, the sensed component 104 may be embodied as, or otherwise include, a powertrain and/or drivetrain component. In such embodiments, it should be appreciated that the sensed component 104 may include one or more elements that are constrained against rotation and/or other movement, such as a housing or case, for example. Furthermore, in other embodiments, it should be appreciated that the sensed component 104 may be constrained against rotation and/or other movement. That being said, in the illustrative embodiment, the sensing system 100 is configured to provide a signal indicative of a rotational speed of the sensed component 104. Of course, it should be appreciated that in other embodiments, the sensing system 100 may be configured to provide a signal indicative of another suitable operational characteristic of the sensed component 104, such as a position of the component 104, a torque produced, transmitted, distributed, and/or stored by the component 104, an acceleration of the component 104, current produced and/or received by the component 104, and voltage produced and/or received by the component 104, for example.

The sensed component 104 may be included in, or otherwise adapted for use with, equipment used in a variety of applications. In one example, the sensed component 104 may be included in, or otherwise adapted for use with, a harvesting machine used in one or more agricultural applications. In another example, the sensed component 104 may be included in, or otherwise adapted for use with, equipment used in lawn and garden, construction, landscaping and ground care, golf and sports turf, forestry, engine and drivetrain, and government and military applications. In such embodiments, the sensed component 104 of the present disclosure may be included in, or otherwise adapted for use with, tractors, front end loaders, scraper systems, cutters and shredders, hay and forage equipment, planting equipment, seeding equipment, sprayers and applicators, tillage equipment, utility vehicles, mowers, dump trucks, backhoes, track loaders, crawler loaders, dozers, excavators, motor graders, skid steers, tractor loaders, wheel loaders, rakes, aerators, skidders, bunchers, forwarders, harvesters, swing machines, knuckleboom loaders, diesel engines, axles, planetary gear drives, pump drives, transmissions, generators, and marine engines, among other suitable equipment.

Figure 2:
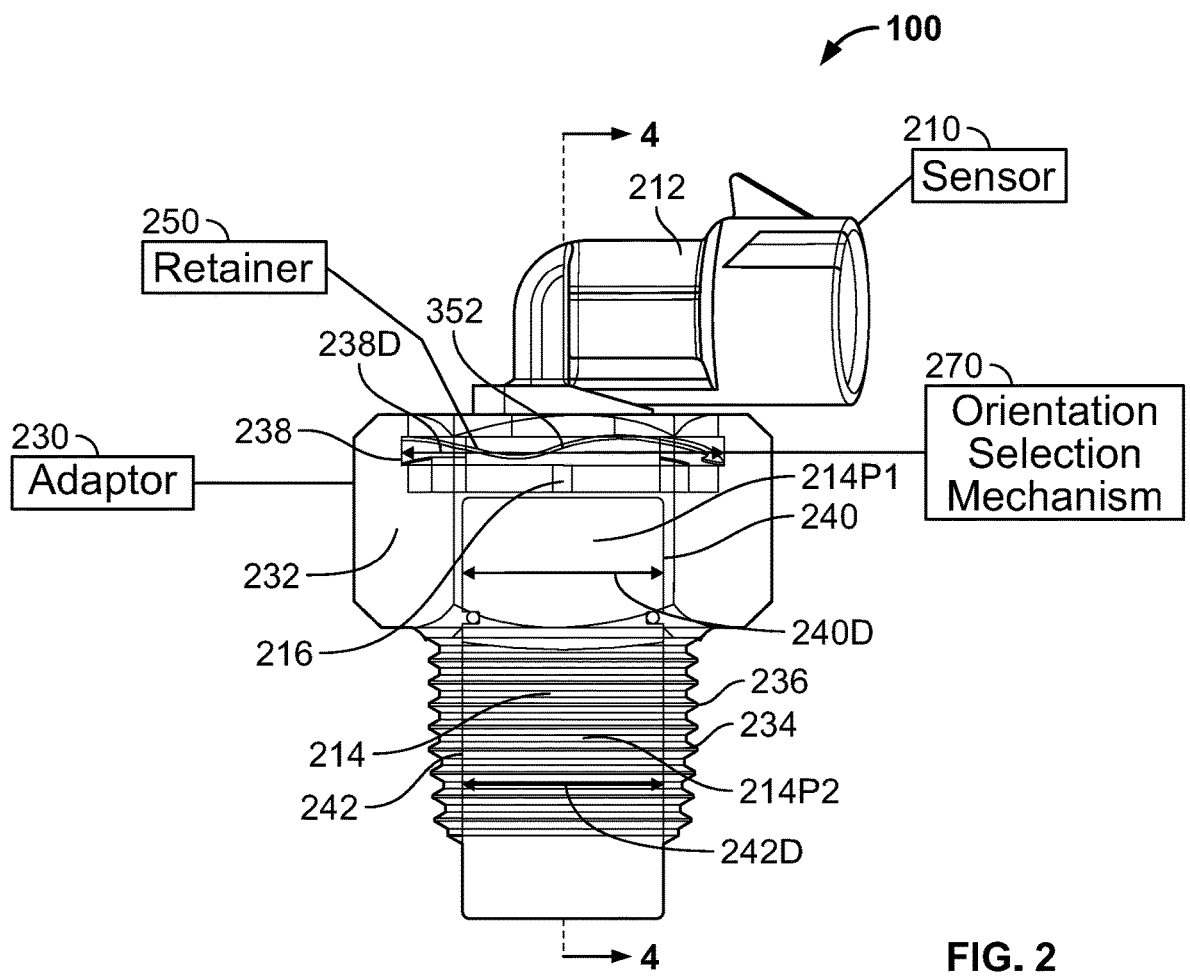
FIG. 2 is front elevation view of the sensing system diagrammatically depicted in FIG. 1.
Figure 3:
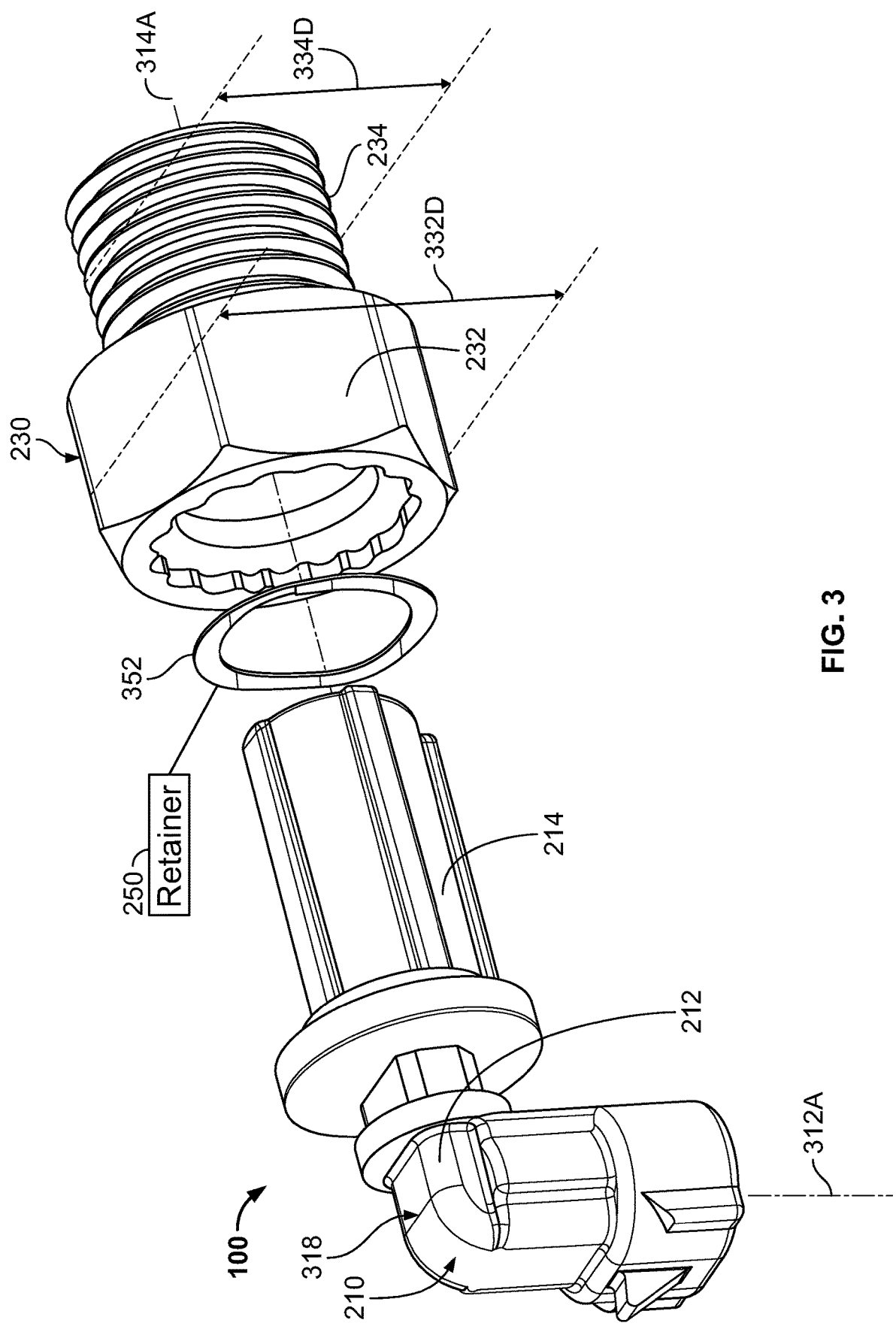
FIG. 3 is an exploded perspective view of the sensing system shown in FIG. 2.

Referring now to FIGS. 2 and 3, the illustrative sensing system 100 includes a hall effect sensor 210, an sensor mount 230, a retainer 250, and an orientation selection mechanism 270. The hall effect sensor 210 is illustratively configured to provide the signal indicative of the rotational speed (or another suitable operational characteristic) of the sensed component 104. The sensor mount 230 is sized to receive the hall effect sensor 210 and configured for attachment to the sensed component 104 to couple the sensor 210 thereto. The retainer 250 is sized for receipt by the sensor mount 230 and configured to retain the hall effect sensor 210 when the sensor 210 is received by the sensor mount 230. The orientation mechanism 270 is configured to permit selection of an orientation of the hall effect sensor 210 relative to the one or more sensing targets 102 when the sensor 210 is received by the sensor mount 230. As described in greater detail below with reference to FIGS. 4 and 5, the orientation selection mechanism 270 includes a feature 470 included in the hall effect sensor 210 and a feature 472 included in the sensor mount 230 that cooperate to permit selection of the orientation of the hall effect sensor 210 relative to the one or more sensing targets 102 in use of the sensing system 100.

The illustrative hall effect sensor 210 is embodied as, or otherwise includes, any device or collection of devices capable of detecting the one or more targets 102 and providing a signal indicative of one or more operational characteristics of the sensed component 104 based on the detection, or lack of detection, of the one or more targets 102. The hall effect sensor 210 illustratively includes a connector crown 212, a body 214 coupled to the connector crown 212 and extending downwardly therefrom, and a shoulder or collar 216 coupled to the body 214 and extending outwardly therefrom. The body 214 and the shoulder 216 extend along an axis 314A (see FIG. 3). The connector crown 212 extends along an axis 312A that is perpendicular or substantially perpendicular to the axis 314A. The connector crown 212, the body 214, and the shoulder 216 illustratively cooperate to define, or are otherwise included in, an exterior housing 318 of the hall effect sensor 210. As discussed below, the body 214 and the shoulder 216 are sized for receipt by the sensor mount 230.

The illustrative sensor mount 230 is embodied as, or otherwise includes, any device or collection of devices capable of receiving the hall effect sensor 210 and coupling to the sensed component 104 such that the hall effect sensor 210 is coupled to the sensed component 104 by the sensor mount 230. The sensor mount 230 (which is shown to be transparent in FIG. 2 for the sake of clarity) illustratively includes a head 232 and a neck 234 coupled to the head 232 and extending downwardly therefrom. The head 232 has a diameter 332D that is greater than a diameter 334D of the neck 234. Whereas the head 232 does not include threading, or is otherwise substantially unthreaded, the neck 234 includes external threads 236 that may be used to attach the sensor mount 230 to the sensed component 104 in use of the illustrative sensing system 100.

As best seen in FIG. 2, the head 232 is formed to include an inner annular groove 238 and a passageway 240 coupled to the groove 238 such that the groove 238 opens into the passageway 240. The groove 238 has a diameter 238D that is greater than a diameter 240D of the passageway 240. The neck 234 is formed to include a passageway 242 that is coupled to the passageway 240 such that the passageway 240 opens into the passageway 242. The passageway 242 has a diameter 242D that is equal, or otherwise substantially identical, to the diameter 240D of the passageway 240.

Figure 4:
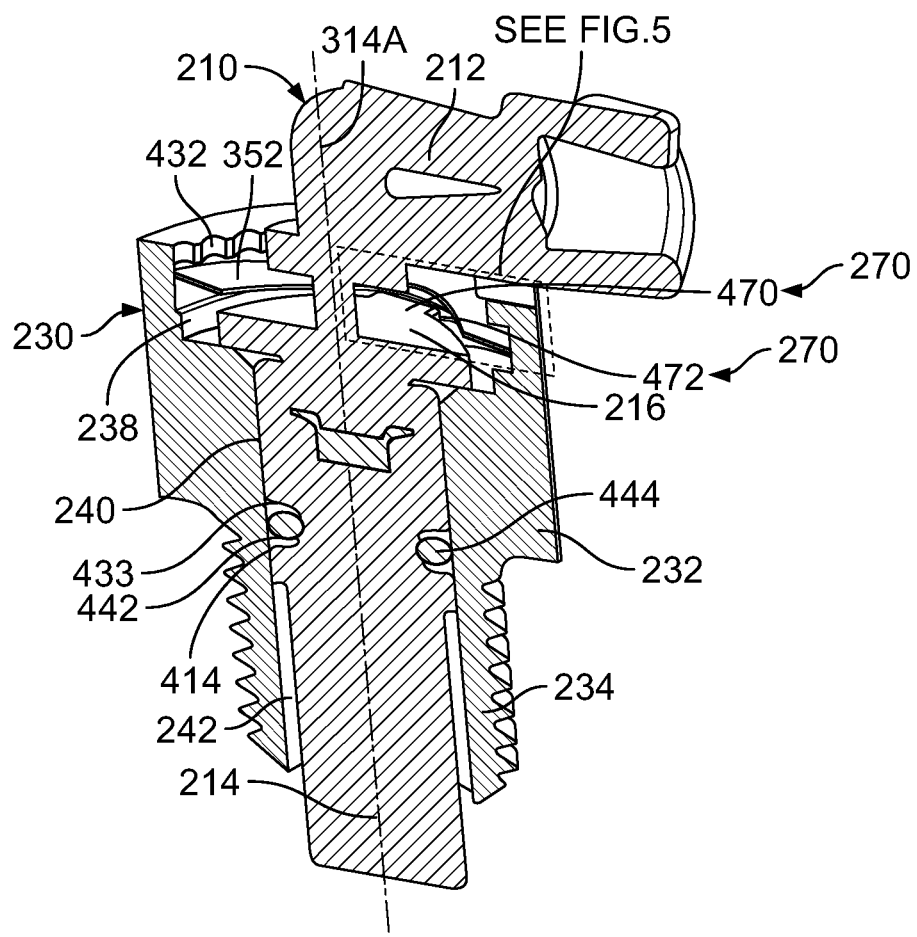
FIG. 4 is a sectional view of the sensing system shown in FIG. 2 taken about line 2-2.

Upon assembly of the illustrative sensing system 100, the shoulder 216 of the hall effect sensor 210 is received by the inner groove 238 of the sensor mount 230 and the body 214 of the sensor 210 is received by the passageways 240, 242 of the sensor mount 230, as best seen in FIGS. 2 and 4. That is, when the sensor 210 is received by the sensor mount 230, the head 232 receives the shoulder 216 and a portion 214P1 of the body 214 and the neck 234 receives a portion 214P2 of the body 214 that extends downwardly from the portion 214P1. In the illustrative embodiment, the portion 214P2 extends through the passageway 242 and outside of the sensor mount 230 in use of the sensing system 100.

The illustrative retainer 250 is embodied as, or otherwise includes, any device or collection of devices capable of being received by the sensor mount 230 and retaining the hall effect sensor 210 when the sensor 210 is received by the sensor mount 230. In the illustrative embodiment, the retainer 250 includes a biasing element 352 sized to be positioned in the inner groove 238 of the sensor mount 230. The biasing element 352 is illustratively embodied as, or otherwise includes, a wave spring. Of course, it should be appreciated that in other embodiments, the biasing element 352 may be embodied as, or otherwise include, another suitable biasing element. Furthermore, in other embodiments, it should be appreciated that the retainer 250 may be embodied as, or otherwise include, another suitable device.

Upon assembly of the illustrative sensing system 100, the wave spring 352 is positioned in the inner groove 238 of the sensor mount 230 in contact with the sensor mount 230 and the shoulder 216 of the hall effect sensor 210 (i.e., when the sensor 210 is received by the sensor mount 230), as best seen in FIGS. 2 and 4. When the hall effect sensor 210 is received by the sensor mount 230 in use of the sensing system 100, the wave spring 352 is configured to bias the shoulder 216 toward the neck 234 of the sensor mount 230. Thus, when the sensor mount 230 is attached to the sensed component 104 in use of the sensing system 100, the downward bias exerted on the shoulder 216 by the wave spring 352 at least partially retains the hall effect sensor 210 in the sensor mount 230.

Figure 5:
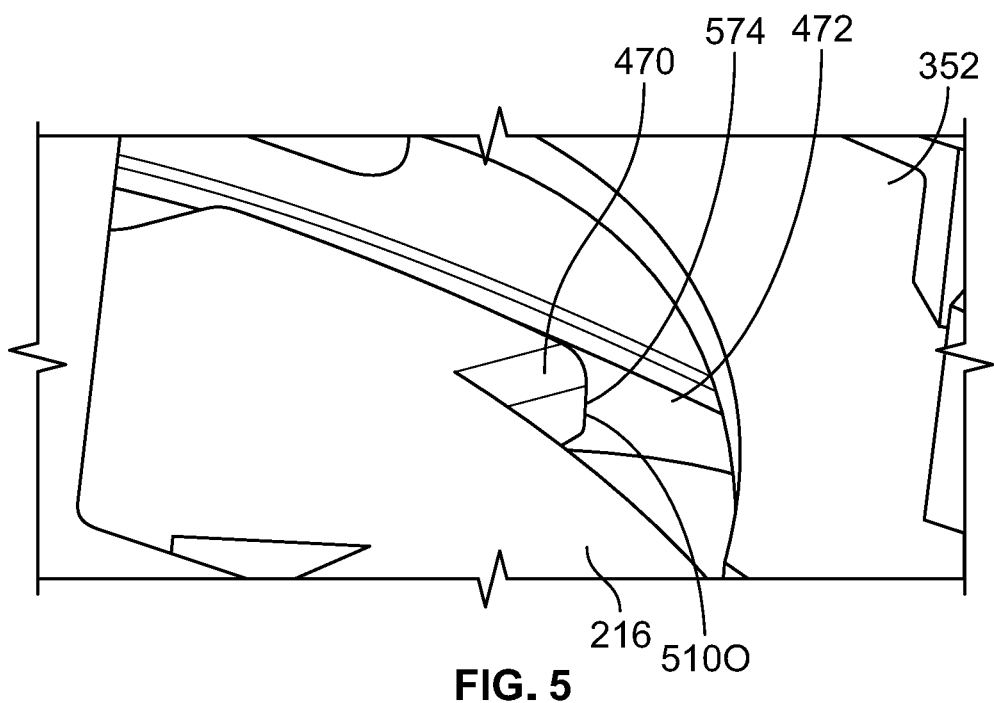
FIG. 5 is a plan view of the sensing system shown in FIG. 2.

Referring now to FIGS. 4 and 5, the illustrative orientation selection mechanism 270 is depicted in detail. The orientation selection mechanism 270 is embodied as, or otherwise includes, any features that cooperate to permit selection of the orientation of the hall effect sensor 210 relative to the one or more sensing targets 102 in use of the illustrative sensing system 100. In the illustrative embodiment, the orientation selection mechanism 270 includes a tab 470 included in the hall effect sensor 210 and an inner indexing ring 472 included in the sensor mount 230. The tab 470 is interconnected with, and extends outwardly from, the shoulder 216 of the sensor 210. The inner indexing ring 472 is formed around the inner periphery of the head 232 of the sensor mount 230. In some embodiments, the indexing ring 472 may be formed around the inner periphery of the inner groove 238 and/or the passageway 240. In any case, when the hall effect sensor 210 is received by the sensor mount 230 in use of the illustrative sensing system 100, the inner indexing ring 472 extends around the axis 314A.

As best seen in FIG. 5, the inner indexing ring 472 is illustratively formed to include notches 574 each configured for interaction with the tab 470 to permit selection of an orientation of the hall effect sensor 210 relative to the one or more sensing targets 102 in use of the sensing system 100, as further discussed below. In other embodiments, however, it should be appreciated that the indexing ring 472 may include other suitable features configured for interaction with the tab 470 as discussed above, such as bumps, projections, protrusions, or the like, for example. In any case, the notches 574 are circumferentially spaced from one another around the inner periphery of the head 232 of the sensor mount 230. When the hall effect sensor 210 is received by the sensor mount 230 in use of the illustrative sensing system 100, the notches 574 are circumferentially spaced from one another about the axis 314A.

In use of the illustrative sensing system 100, each of the notches 574 corresponds to, defines, or is otherwise associated with, a discrete orientation 510Θ of the hall effect sensor 210 relative to the one or more sensing targets 102, as shown in FIG. 5. Of course, it should be appreciated that each discrete orientation 510Θ of the sensor 210 may be characterized relative to the sensor mount 230 and the tab 470 thereof. Regardless, in use of the sensing system 100, each of the notches 574 corresponds to, defines, or is otherwise associated with, a discrete angular orientation 510Θ of the hall effect sensor 210 relative to the one or more sensing targets 102 that may be measured about the axis 314A.

When the tab 470 of the hall effect sensor 210 interacts with one of the notches 574 of the sensor mount 230 in use of the illustrative sensing system 100 as shown in FIG. 5, the bias applied to the sensor 210 by the wave spring 352 (not shown in FIG. 5) seats or retains the sensor 210 relative to the one or more sensing targets 102 and the sensor mount 230 in the discrete orientation 510Θ corresponding to the one notch 574. As further discussed below, the hall effect sensor 210 is movable relative to the sensor mount 230 along the axis 314A against the bias of the wave spring 352 in use of the sensing system 100. Movement of the sensor 210 relative to the sensor mount 230 along the axis 314A against the bias of the wave spring 352 permits rotation of the sensor 210 relative to the sensor mount 230 about the axis 314A. Rotation of the sensor 210 relative to the sensor mount 230 about the axis 314A allows interaction of the tab 470 with any one of the notches 574, thereby permitting selection of the orientation of the sensor 210 relative to the one or more sensing targets 102 and the sensor mount 230 in use of the sensing system 100.

As apparent from the description of FIGS. 1-4 above, in use of the illustrative sensing system 100, the hall effect sensor 210 is formed of solid material without a hole to receive a fastener to secure the sensor 210 to the sensed component 104. Moreover, as apparent from the description of FIGS. 1-4 above, apart from the sensor mount 230, the illustrative orientation selection mechanism 270 lacks a fastener. Consequently, compared to other configurations, the illustrative sensing system 100 may provide, or otherwise be associated with, less cost and complexity.

As best seen in FIG. 4, the illustrative head 232 of the sensor mount 230 is formed to include a grooved inner surface 432. In the illustrative embodiment, the inner surface 432 has a shape and/or contour complementary to the shape and/or contour of the wave spring 352, which has a generally undulated shape and/or contour. The wave spring 352 may contact, engage, and/or directly interact with the inner surface 432 in use of the illustrative sensing system 100. In other embodiments, however, it should be appreciated that the wave spring 352 may be formed to include a groove having a shape and/or contour that is complementary to the shape and/or contour of the inner surface 432, which may have a generally undulated shape and/or contour.

As best seen in FIG. 4, in the illustrative embodiment, the body 214 of the hall effect sensor 210 and at least one of the head 232 and the neck 234 of the sensor mount 230 cooperate to define an annular cavity 442 in use of the sensing system 100. More specifically, a groove 414 formed in the body 214 and an inner surface 433 of at least one of the head 232 and the neck 234 cooperate to define the cavity 442 in use of the system 100. Balls 444 are illustratively positioned in the cavity 442 to facilitate movement (e.g., rotation about the axis 314A) of the hall effect sensor 210 relative to the sensor mount 230 in use of the system 100.

Figure 6:
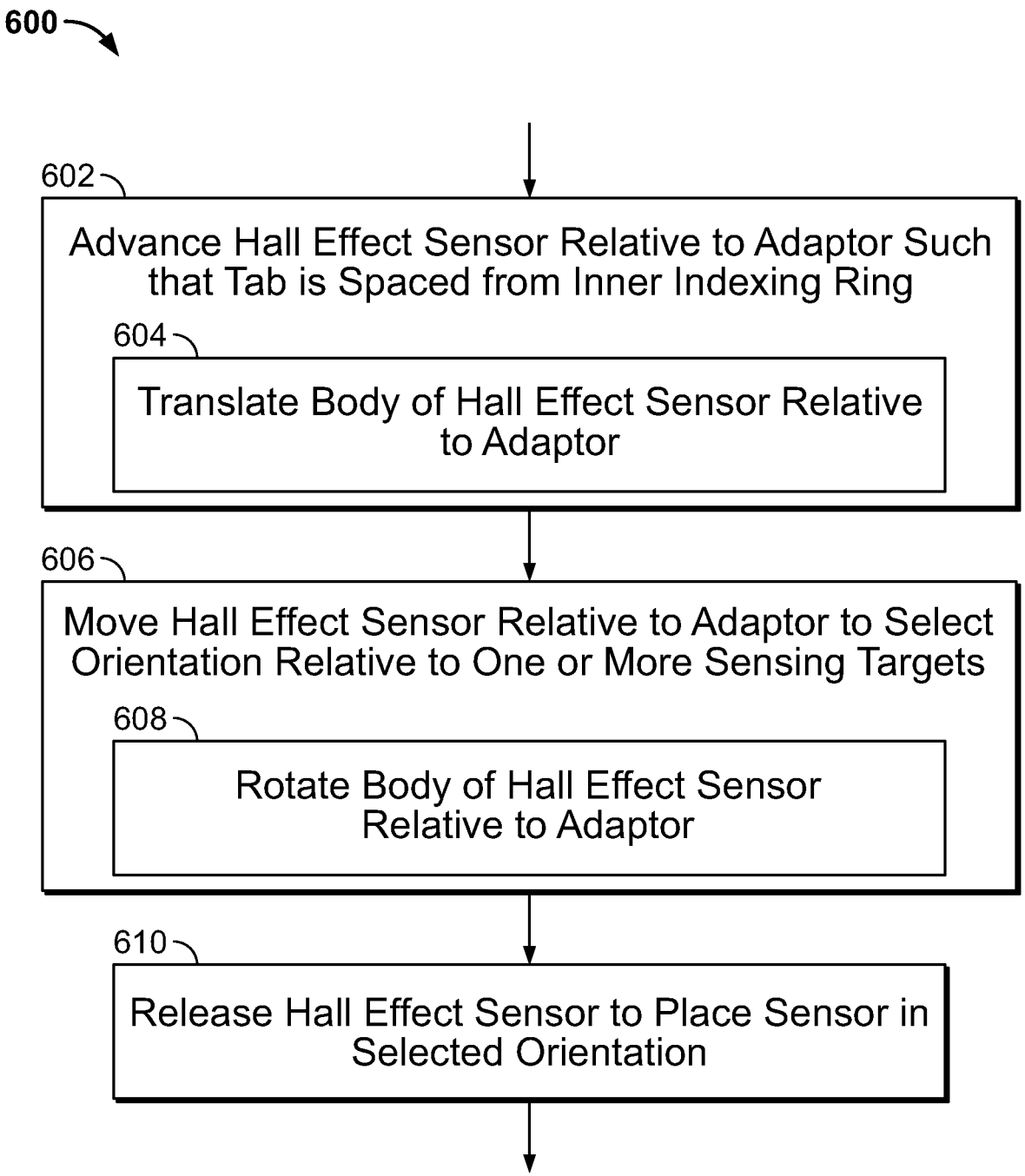
FIG. 6 is a simplified flowchart of a method of adjusting the sensing system shown in FIG. 2.

Referring now to FIG. 6, in the illustrative embodiment, an operator may manually perform a method 600 of adjusting the sensing system 100 (i.e., when the system 100 is coupled to the sensed component 104). Of course, in other embodiments, it should be appreciated that performance of the illustrative method 600 may be automated. In such embodiments, the blocks of the method 600 described below may be embodied as, or otherwise included in, instructions stored in one or more memory devices of a controller (not shown) that are executable by one or more processors of the controller. In any case, although the method 600 is described below with regard to the illustrative FIG. 6 in which the blocks of the method 600 are shown in an illustrative format and sequence, it should be appreciated that the method 600 is not limited to the particular sequence of blocks illustrated in FIG. 6. Additionally, it should be appreciated that in other embodiments, some of the blocks of the method 600 may be performed in parallel, or otherwise contemporaneously with, other blocks and/or performed in an alternative sequence. Finally, it should be appreciated that the method 600 may incorporate blocks in addition to those illustrated in FIG. 6.

The illustrative method 600 begins with block 602. It should be appreciated that prior to performance of block 602, the hall effect sensor 210 has an initial orientation (e.g., any one of the discrete angular orientations 510Θ) relative to the one or more sensing targets 102 and the sensor mount 230. That being said, in block 602, the hall effect sensor 210 is advanced relative to the sensor mount 230 such that the tab 470 of the orientation selection mechanism 270 is spaced from the inner indexing ring 472 of the orientation selection mechanism 270. That is, the body 214 is advanced relative to the sensor mount 230 against the bias of the wave spring 352 such that the tab 470 is spaced from the indexing ring 472. To perform the illustrative block 602, block 604 is performed. In block 604, the body 214 is translated relative to the sensor mount 230 along the axis 314A. It should be appreciated that to perform block 604, the portion 214P2 of the body 214 may be grasped by an operator and translated relative to the sensor mount 230 along the axis 314A.

From block 604, the illustrative method 600 subsequently proceeds to block 606. In block 606, the hall effect sensor 210 is moved relative to the sensor mount 230 to select an orientation 510Θ thereof relative to the one or more sensing targets 102. It should be appreciated that the orientation 510Θ selected in block 604 is different from the initial orientation 510Θ of the sensor 210 prior to performance of block 602. That being said, to perform block 606, block 608 is performed. In block 608, the body 214 is rotated relative to the sensor mount 230 about the axis 314A to the selected orientation 510Θ.

The illustrative method 600 subsequently proceeds from block 608 to block 610. In block 610, the hall effect sensor 210 (e.g., the body 214) is released to place the sensor 210 in the selected orientation 510Θ. That is, in block 610, the sensor 210 is released such that the bias of the wave spring 352 urges the tab 470 into interaction with the notch 574 corresponding to the selected orientation 510Θ. In some embodiments, performance of block 610 corresponds to, or is otherwise associated with, performance of one iteration of the illustrative method 600.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

The invention claimed is:

1. A sensing system comprising:
a sensor configured to provide a signal indicative of an operational characteristic of a sensed component;
an sensor mount sized to receive the sensor and configured for attachment to the sensed component to couple the sensor thereto;
a retainer sized for receipt by the sensor mount and configured to retain the sensor when the sensor is received by the sensor mount; and
an orientation selection mechanism configured to permit selection of an orientation of the sensor relative to one or more sensing targets when the sensor is received by the sensor mount, wherein the orientation selection mechanism includes a first feature included in the sensor and a second feature included in the sensor mount, and wherein the first and second features cooperate to permit selection of the orientation of the sensor relative to the one or more sensing targets in use of the sensing system.

2. The sensing system of claim 1, wherein the sensor is a hall effect sensor that includes a sensor body and a shoulder extending outwardly from the sensor body, and wherein the sensor mount is sized to receive the sensor body and the shoulder.

3. The sensing system of claim 2, wherein the sensor mount is formed to include an inner groove sized to receive the shoulder, and wherein the retainer includes a wave spring that is positioned in the inner groove in contact with the sensor mount and the shoulder when the sensor is received by the sensor mount.

4. The sensing system of claim 3, wherein the sensor mount includes a neck having a first diameter and a head having a second diameter greater than the first diameter, and wherein the wave spring is configured to bias the shoulder toward the neck when the sensor is received by the sensor mount.

5. The sensing system of claim 4, wherein the neck is configured to receive a portion of the sensor body and the head is configured to receive another portion of the sensor body and the shoulder.

6. The sensing system of claim 5, wherein the neck includes external threads that may be used to attach the sensor mount to the sensed component.

7. The sensing system of claim 1, wherein the sensor includes a sensor body extending along an axis and a shoulder extending outwardly from the sensor body, the first feature includes a tab extending outwardly from the shoulder, and the second feature includes an inner indexing ring that extends around the axis when the sensor is received by the sensor mount.

8. The sensing system of claim 7, wherein the inner indexing ring is formed to include a plurality of notches each configured for interaction with the tab to permit selection of the orientation of the sensor relative to the one or more sensing targets in use of the sensing system.

9. The sensing system of claim 8, wherein the plurality of notches are circumferentially spaced from one another about the axis when the sensor is received by the sensor mount, and wherein the sensor is configured for rotation about the axis when the sensor is received by the sensor mount such that the tab may interact with any one of the plurality of notches to permit selection of the orientation of the sensor relative to the one or more sensing targets in use of the sensing system.

10. The sensing system of claim 9, wherein the sensor is movable relative to the sensor mount along the axis against a bias of the retainer when the sensor is received by the sensor mount to permit rotation of the sensor about the axis.

11. The sensing system of claim 1, wherein the sensor is formed without a hole to receive a fastener to secure the sensor to the sensed component.

12. A sensing system comprising:
a hall effect sensor configured to provide a signal indicative of an operational characteristic of a sensed component, the hall effect sensor including a sensor body extending along an axis and a shoulder extending outwardly from the sensor body;
an sensor mount sized to receive the hall effect sensor and configured for attachment to the sensed component to couple the hall effect sensor thereto, the sensor mount formed to include an inner groove sized to receive the shoulder;
a wave spring configured to retain the hall effect sensor when the hall effect sensor is received by the sensor mount, the wave spring positioned in the inner groove in contact with the sensor mount and the shoulder when the hall effect sensor is received by the sensor mount; and
an orientation selection mechanism configured to permit selection of one orientation of a plurality of discrete orientations of the hall effect sensor relative to one or more sensing targets when the hall effect sensor is received by the sensor mount, wherein the orientation selection mechanism includes a tab included in the hall effect sensor that extends outwardly from the shoulder and an inner indexing ring included in the sensor mount that extends around the axis when the hall effect sensor is received by the sensor mount, and wherein the inner indexing ring is formed to include a plurality of notches each configured for interaction with the tab to permit selection of the one orientation of the plurality of discrete orientations of the hall effect sensor relative to the one or more sensing targets in use of the sensing system.

13. The sensing system of claim 12, wherein the plurality of notches are circumferentially spaced from one another about the axis when the hall effect sensor is received by the sensor mount.

14. The sensing system of claim 13, wherein the hall effect sensor is configured for rotation about the axis when the hall effect sensor is received by the sensor mount such that the tab may interact with any one of the plurality of notches to permit selection of the one orientation of the hall effect sensor relative to the one or more sensing targets in use of the sensing system.

15. The sensing system of claim 14, wherein the hall effect sensor is movable relative to the sensor mount along the axis against a bias of the wave spring when the hall effect sensor is received by the sensor mount to permit rotation of the hall effect sensor about the axis.

16. The sensing system of claim 12, wherein the sensor is formed without a hole to receive a fastener to secure the sensor to the sensed component.

17. The sensing system of claim 16, wherein the orientation selection mechanism lacks a fastener.

18. A method of adjusting a sensing system coupled to a sensed component, the sensing system including a sensor having a sensor body and a shoulder extending outwardly therefrom, an sensor mount that receives the sensor such that the sensor has an initial orientation relative to one or more sensing targets, a biasing element held by the sensor mount, and an orientation selection mechanism, the method comprising:
advancing the sensor body relative to the sensor mount against a bias of the biasing element such that a tab of the orientation selection mechanism that extends outwardly from the shoulder is spaced from an inner indexing ring of the orientation selection mechanism that extends around an axis;
moving the sensor relative to the sensor mount to select one orientation of a plurality of discrete orientations of the sensor relative to the one or more sensing targets that is different from the initial orientation; and
releasing the sensor such that the bias of the biasing element urges the tab into interaction with one of a plurality of notches of the inner indexing ring to place the sensor in the one selected orientation.

19. The method of claim 18, wherein advancing the sensor body relative to the sensor mount includes translating the sensor body relative to the sensor mount along the axis.

20. The method of claim 19, wherein moving the sensor relative to the sensor mount includes rotating the sensor body relative to the sensor mount about the axis.

* * * * *